United States Patent [19]
Harmel et al.

[11] Patent Number: 5,661,079
[45] Date of Patent: Aug. 26, 1997

[54] CONTACTING PROCESS USING O-SIPOS LAYER

[75] Inventors: Hartmut Harmel, Hofgeismar; Uwe Kellner-Werdehausen, Pretzfeld, both of Germany

[73] Assignee: Temic Telefunken microelectronic GmbH, Heilbronn, Germany

[21] Appl. No.: 490,487

[22] Filed: Jun. 14, 1995

[30] Foreign Application Priority Data

Jul. 12, 1994 [DE] Germany .................. 44 24 420.7

[51] Int. Cl.⁶ ............................................. H01L 21/28
[52] U.S. Cl. .......................... 438/660; 438/763; 438/958
[58] Field of Search ................................. 437/187, 188, 437/233, 194, 197, 967, 980; 257/914

[56] References Cited

U.S. PATENT DOCUMENTS

| H665 | 8/1989 | Knolle et al. | 357/52 |
|---|---|---|---|
| 3,983,264 | 9/1976 | Schroen et al. | 427/39 |
| 4,062,707 | 12/1977 | Mochizuki et al. | 437/233 |
| 4,332,837 | 6/1982 | Peyre-Lavigne | 437/188 |
| 4,489,103 | 12/1984 | Goodman et al. | 437/233 |
| 4,778,776 | 10/1988 | Tong et al. | 437/228 |
| 4,827,324 | 5/1989 | Blanchard | 437/238 |
| 5,410,177 | 4/1995 | Harmel et al. | 257/567 |

FOREIGN PATENT DOCUMENTS

| 3138324 | 4/1983 | Germany . |
|---|---|---|
| 61-147581 | 7/1986 | Japan . |
| 2143083 | 1/1985 | United Kingdom . |
| 2173035 | 10/1986 | United Kingdom . |

OTHER PUBLICATIONS

Matsushita et al, "A SIPOS–Si Heterojunction Transistor", Jap. Jour. Appl. Phys., vol. 20, 1981, pp. 75–81.

A. Mimura et al.: "High–Voltage Planar Structure Using $SiO_2$–SIPOS–$SiO_2$ Film". In: IEEE Electron Device Letters, vol. EDL–6, No. 4, Apr. 1985, pp. 189–191.

Y. H. Kwark et al.: "SIPOS Heterojunction contacts to Silicon". In: IEDM 84, pp. 742–745, 1984.

*Primary Examiner*—John Niebling
*Assistant Examiner*—Thomas G. Bilodeau
*Attorney, Agent, or Firm*—Spencer & Frank

[57] ABSTRACT

The invention relates to a method for contacting SIPOS-passivated semiconductor zones on a semiconductor body, where the removal of the oxide layer from the wafer surface takes place at the same time as the oxide etching before SIPOS passivation. The double-layered SIPOS passivation consists here of a N-SIPOS layer and a O-SIPOS layer. For contact opening, only the N-SIPOS layer is removed by wet chemical etching. By annealing the previously vaporized and structured metallization, a good contact results which can also carry a high current. The process according to the invention involves a simple sequence of operations and an underetching of the passivation layers and the disadvantages resulting from this are reliably avoided.

12 Claims, 2 Drawing Sheets

CONTACTING PROCESS USING O-SIPOS LAYER

BACKGROUND OF THE INVENTION

The invention relates to a method for contacting SIPOS-passivated semiconductor zones of a semiconductor body with at least one pn junction and where part of the surface of the semiconductor body is protected by an oxide layer.

The use of so-called SIPOS passivation layers (Semi-Insulating-Poly-Silicon) for the manufacture of semiconductor components, in particular of high-voltage power transistors, is known. In general, a double layer is applied where the first layer is of O-SIPOS (oxygen-doped) and the second layer is of N-SIPOS (nitrogen-doped). To manufacture a SIPOS double layer of this kind, it is customary to apply a CVD (Chemical Vapor Deposition) process.

Before the places to be contacted, for example, the emitter or base zones, can come into contact with a metallization that is usually made of aluminum, it must first be ensured, with the help of a so-called contact opening process, that the N-SIPOS, O-SIPOS and oxide layers previously applied in other steps of the process are removed again from these places. Frequently, the contact opening is accomplished by a wet chemical etching, and less frequently by a plasma etching process because of the considerably greater technological effort involved. Another possibility, which also involves a great deal of technological effort, is to make the contact in several masking steps. In most cases, however, the contact opening process applied is that of wet chemical etching, the process involving little technology. A disadvantage of this etching method is that hollow spaces are often formed between the passivation layers and a metallization due to under-etching, as well as discontinuities in the metallization.

SUMMARY OF THE INVENTION

The object of the invention is to provide a method requiring, on the one hand, only little technological effort and where, on the other hand, metallization discontinuities and hollow spaces in the region of the contact opening places are reliably avoided.

According to the invention there are provided the following steps:

a) opening of the oxide layer at least over those semiconductor zones that are to be contacted;

b) application of a single or double-layered SIPOS passivation over the entire area of the surface of the semiconductor body;

c) if a double layered SIPOS passivation is used, removal of the upper layer of the double-layered SIPOS passivation over those zones that are to be contacted;

d) application and structuring of metallization on the SIPOS passivation at desired contact locations corresponding to those contact openings from which previously the upper layer of the double-layered SIPOS passivation was removed when using a double layered passivation; and e) heat treatment (annealing) of the semiconductor body.

Accordingly, at the same time as the oxide etching takes place before the application of the SIPOS double layer over the entire area, the oxide layers that have been created in the contact zones while diffusion of base and emitter has taken place are removed by a wet etching process. This is followed by the application of a single or double-layered SIPOS passivation. If a double-layered SIPOS passivation is used, only the top layer is removed by etching in the subsequent contact opening process.

The particular advantages resulting from the invention are that hollow spaces between the metallization and passivation layers, in which contamination with corrosive effects can collect, and discontinuities in the metallization are avoided simply by making minor changes to individual process steps and with modified masks, without there being a need to provide additional masks or process steps or indeed to develop a new process.

BRIEF DESCRIPTION OF THE DRAWINGS

An embodiment example of the process according to the invention will now be shown in the drawings and be described in more detail below.

The FIGS. 1a to 1e show the sketched cross-section of a partial semiconductor body with the zones, layers and metallization that are relevant to the invention.

DESCRIPTION OF THE PREFERRED EMBODIMENTS

Figure 1A:
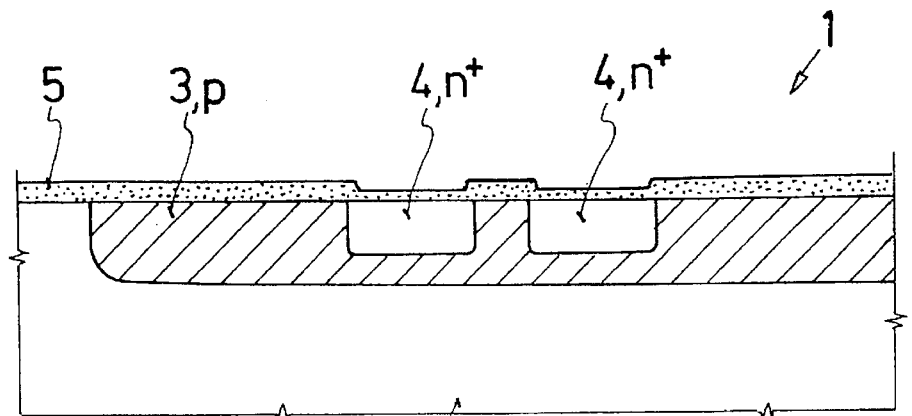

FIG. 1a shows, on the basis of a NPN transistor, a semiconductor body 1 comprising, an n-doped substrate 2, p-doped base zones 3 included in it, and an oxide layer 5 situated on the surface of the substrate 2 having with the base zones 3 being included in the substrate 2 by means of an already known process called base diffusion. In a further process step known as emitter diffusion or emitter drive in, higher-doped and n-conductive emitter zones 4 are included in the substrate 2 and in the base zones 3.

Figure 1B:
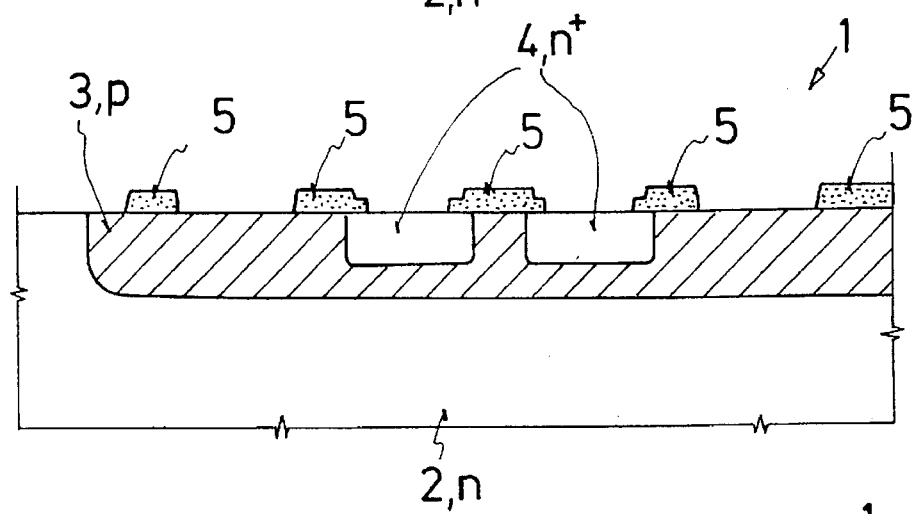

FIG. 1b shows the state that results after the oxide layer 5 has been removed by means of an etching process at the junction termination and partially from the base and emitter zones 3 and 4.

The removal of the oxide layer 5 over the entire surface area by means of an etching process, requiring no mask, is another possibility for the process sequence described above. This variant should be selected if a $h_{FE}$ loss can be accepted and it is of greater importance for the user to have one mask less to make.

Figure 1C:
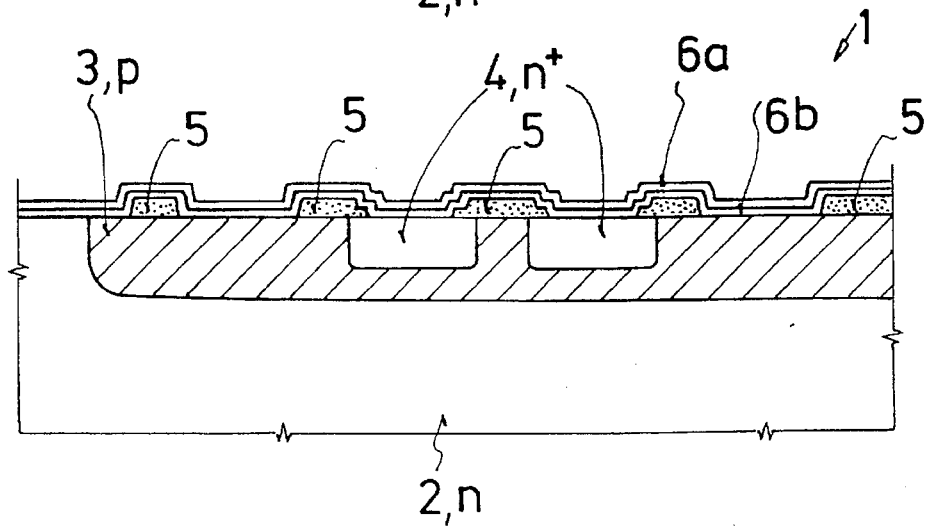

FIG. 1c shows the semiconductor body 1 with the double-layered SIPOS passivation layer, made up of N-SIPOS 6a and O-SIPOS 6b, applied over the whole surface area.

Figure 1D:
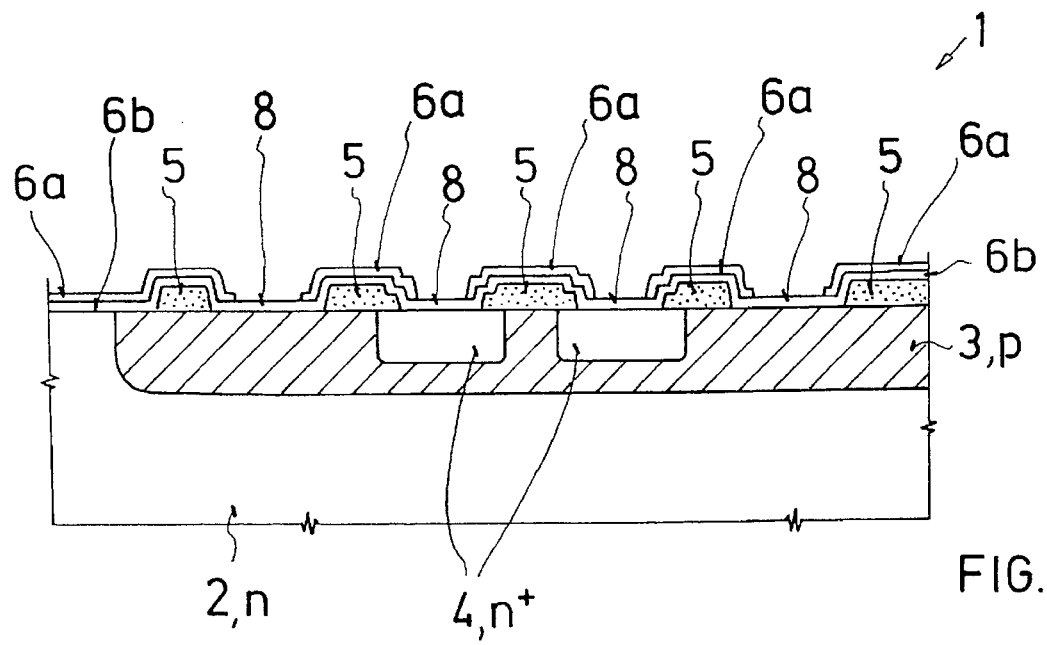

The so-called photo lithography process (coating with photoresist, mask alignment, exposure to light) follow on from passivation. As shown in FIG. 1d, the N-SIPOS layer 6a is then removed in an etching process at all those places where contacting is to take place later. The so-called contact openings 8 in the N-SIPOS layer result from this. The surface of the semiconductor body 1 is then vaporized with aluminum over the entire surface and structured in a further photo lithography and etching process.

Figure 1E:
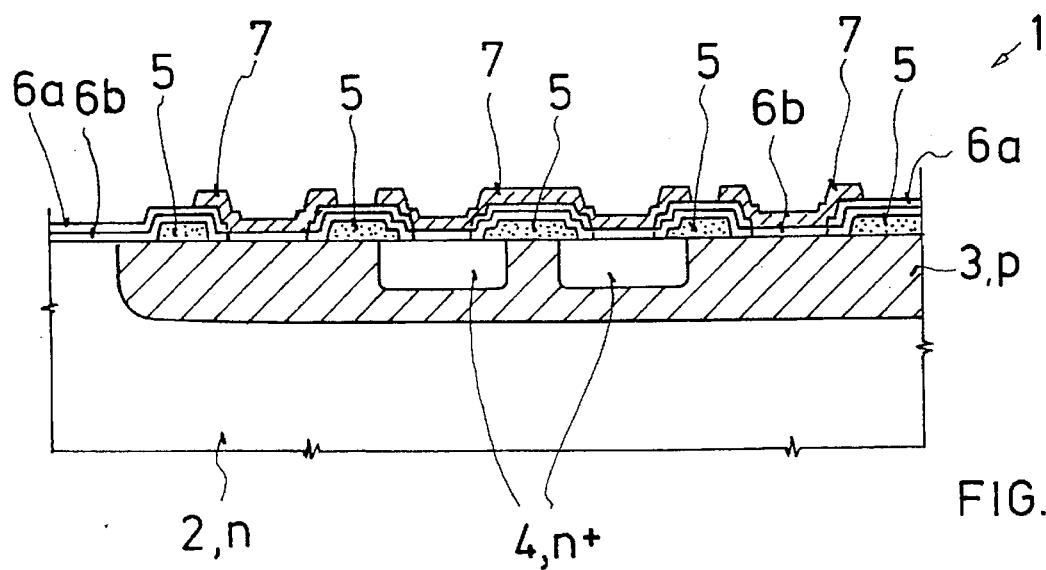

As can be seen from FIG. 1e, the metallization 7, which is preferably of aluminum is applied directly to the non-removed O-SIPOS layer 6b on the contact openings 8 (FIG. 1d) made in the previous process step.

It has been found that, once the intermediate steps of photoresist removal and cleaning have taken place, the aluminum of the metallization 7 migrates into the silicon through the O-SIPOS layer 6b during the subsequent heat treatment (or annealing), and that in accordance with all test results obtained so far a very good contact is formed which has a high current carrying capacity.

The annealing of the metallization takes place in a conventional heating furnace at a temperature of between 450° C. and 500° C.

The process steps that follow, known to the expert in this field and therefore not shown in the Figures, include the so-called back-side process in which the back-side of a wafer is coated with, for example, a chrome-nickel-gold layer in order to ensure a low transition resistance and a high current carrying capacity for this contact which is generally used as a collector connection.

The process described here is suitable for contacting of SIPOS passivated semiconductor zones in diode, transistor, GTO, IGBT, Power-MOS or IC structures.

What is claimed is:

1. Process for contacting SIPOS passivated semiconductor zones of a semiconductor body with at least one pn junction, and with the surface of the semiconductor body being protected by an oxide layer, wherein said process involves the following process steps:

a) opening the oxide layer at least over those semiconductor zones that are to be contacted;
    b) applying a double-layered SIPOS passivation over the entire area of the surface of the semiconductor body;
    c) removing only the upper layer of the double-layered SIPOS passivation over those zones that are to be contacted to provide contact openings in the upper layer of the SIPOS passivation;
    d) applying and structuring metallization on the lower layer of the double-layered SIPOS passivation within those contact openings from which previously the upper layer of the double-layered SIPOS passivation was removed; and
    e) heat treating (annealing) the semiconductor body.

2. Process in accordance with claim 1, wherein the double-layered SIPOS passivation is made up of a nitrogen-doped N-SIPOS layer and an oxygen-doped O-SIPOS layer, where the O-SIPOS layer is applied first to the surface of the semiconductor body and then the N-SIPOS layer on the O-SIPOS layer.

3. Process in accordance with claim 1, wherein the single SIPOS passivation layer is made up of an oxygen-doped O-SIPOS layer that is applied to the surface of the semiconductor body.

4. Use of the process in accordance with claim 1 for the production of diode, transistor, GTO, IGBT, Power-MOS or IC structures.

5. Process for contacting SIPOS passivated semiconductor zones of a semiconductor body having at least one pn junction, with the surface of the semiconductor body being protected by an oxide layer, said process comprising the following process steps:

a) providing openings in the oxide layer at least over those semiconductor zones of the semiconductor body to be contacted;
    b) applying a SIPOS passivation over the entire surface area of the semiconductor body;
    c) applying and structuring metallization on the layer of SIPOS passivation over the portions of the semiconductor body that are to be contacted; and,
    d) heat treating (annealing) the semiconductor body to cause the metallization to contact the semiconductor body surface via the layer of SIPOS passivation.

6. Process in accordance with claim 5 wherein the SIPOS passivation is a single SIPOS passivation layer.

7. Process in accordance with claim 5 wherein the step of heat treating is carried out at 450°–500° C.

8. Process in accordance with claim 5 wherein the SIPOS passivation layer is a double-layered SIPOS passivation including an upper SIPOS passivation layer and a lower SIPOS passivation layer; said process further comprises removing, prior to said step of applying and structuring, only the upper layer of the double-layered SIPOS passivation over those portions of the semiconductor body to be contacted to provide openings in the upper SIPOS passivation layer; and said step of applying and structuring includes applying the metallization directly on the lower SIPOS passivation layer within the openings found in the upper SIPOS passivation layer.

9. The process in accordance with claim 8 wherein the double-layered SIPOS passivation is formed of a nitrogen-doped N-SIPOS layer and an oxygen-doped O-SIPOS layer, where the O-SIPOS layer is applied first to the surface of the semiconductor body and then the N-SIPOS layer is applied on the O-SIPOS layer.

10. Process in accordance with claim 9 wherein aluminum is used for the metallization.

11. Process in accordance with claim 3 wherein aluminum is used for the metallization.

12. Process in accordance with claim 2 wherein aluminum is used for the metallization.

* * * * *